United States Patent
Zhang

(10) Patent No.: US 10,700,686 B2
(45) Date of Patent: *Jun. 30, 2020

(54) CONFIGURABLE COMPUTING ARRAY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

(*) Notice: Subject to any disclaimer, the term of this patent is extended or adjusted under 35 U.S.C. 154(b) by 239 days.

This patent is subject to a terminal disclaimer.

(21) Appl. No.: 16/186,571

(22) Filed: Nov. 11, 2018

(65) Prior Publication Data

US 2019/0158095 A1   May 23, 2019

Related U.S. Application Data

(63) Continuation-in-part of application No. 16/059,023, filed on Aug. 8, 2018, now Pat. No. 10,312,917, (Continued)

(30) Foreign Application Priority Data

| Mar. 5, 2016 | (CN) | 2016 1 0125227 |
| May 10, 2016 | (CN) | 2016 1 0307102 |
| Mar. 3, 2017 | (CN) | 2017 1 0122749 |
| Mar. 6, 2017 | (CN) | 2017 1 0126067 |
| Oct. 19, 2017 | (CN) | 2017 1 0980620 |
| Oct. 19, 2017 | (CN) | 2017 1 0996864 |
| Oct. 20, 2017 | (CN) | 2017 1 0980779 |
| Oct. 20, 2017 | (CN) | 2017 1 0980813 |

(Continued)

(51) Int. Cl.
*G06F 7/38* (2006.01)
*H03K 19/173* (2006.01)
(Continued)

(52) U.S. Cl.
CPC .......... *H03K 19/1776* (2013.01); *G11C 5/02* (2013.01); *G11C 5/025* (2013.01);
(Continued)

(58) Field of Classification Search
None
See application file for complete search history.

(56) References Cited

U.S. PATENT DOCUMENTS

| 4,870,302 A | 9/1989 | Freeman |
| 5,046,038 A | 9/1991 | Briggs et al. |

(Continued)

OTHER PUBLICATIONS

Paul et al., "Reconfigurable Computing Using Content Addressable Memory for Improved Performance and Resource Usage", Design Automation Conference (DAC), pp. 786-791, 2008.
(Continued)

*Primary Examiner* — Anh Q Tran

(57) ABSTRACT

A configurable computing array comprises at least an array of configurable interconnects, at least an array of configurable logic elements and at least an array of configurable computing elements. Each configurable computing element comprises at least a programmable memory for storing a look-up table (LUT) for a math function.

20 Claims, 13 Drawing Sheets

Related U.S. Application Data which is a continuation-in-part of application No. 15/793,912, filed on Oct. 25, 2017, now Pat. No. 10,075,168, which is a continuation of application No. 15/450,049, filed on Mar. 6, 2017, now Pat. No. 9,838,021, which is a continuation-in-part of application No. 15/450,017, filed on Mar. 5, 2017, now Pat. No. 9,948,306, said application No. 16/059,023 is a continuation-in-part of application No. 15/793,968, filed on Oct. 25, 2017, now abandoned, which is a continuation-in-part of application No. 15/450,049, filed on Mar. 6, 2017, now Pat. No. 9,838,021, which is a continuation-in-part of application No. 15/450,017, filed on Mar. 5, 2017, now Pat. No. 9,948,306, said application No. 16/059,023 is a continuation-in-part of application No. 15/793,927, filed on Oct. 25, 2017, now Pat. No. 10,075,169, which is a continuation-in-part of application No. 15/450,049, filed on Mar. 6, 2017, now Pat. No. 9,838,021, which is a continuation-in-part of application No. 15/450,017, filed on Mar. 5, 2017, now Pat. No. 9,948,306, said application No. 16/059,023 is a continuation-in-part of application No. 15/793,933, filed on Oct. 25, 2017, now Pat. No. 10,141,939, which is a continuation-in-part of application No. 15/450,049, filed on Mar. 6, 2017, now Pat. No. 9,838,021, which is a continuation-in-part of application No. 15/450,017, filed on Mar. 5, 2017, now Pat. No. 9,948,306.

(30) Foreign Application Priority Data

| Oct. 20, 2017 | (CN) | ............... 2017 1 0980817 |
|---|---|---|
| Oct. 20, 2017 | (CN) | ............... 2017 1 0980826 |
| Oct. 20, 2017 | (CN) | ............... 2017 1 0980827 |
| Oct. 20, 2017 | (CN) | ............... 2017 1 0980967 |
| Oct. 20, 2017 | (CN) | ............... 2017 1 0980989 |
| Oct. 20, 2017 | (CN) | ............... 2017 1 0981043 |
| Oct. 20, 2017 | (CN) | ............... 2017 1 0998652 |
| Oct. 23, 2017 | (CN) | ............... 2017 1 0989881 |
| Oct. 23, 2017 | (CN) | ............... 2017 1 0989901 |

(51) Int. Cl.

| H03K 19/177 | (2020.01) |
|---|---|
| H03K 19/1776 | (2020.01) |
| G11C 5/02 | (2006.01) |
| H03K 19/17736 | (2020.01) |
| H03K 19/17728 | (2020.01) |
| H01L 27/24 | (2006.01) |
| H01L 27/1157 | (2017.01) |
| H01L 45/00 | (2006.01) |
| H01L 27/11582 | (2017.01) |

(52) U.S. Cl.
CPC .... *H01L 27/1157* (2013.01); *H01L 27/11582* (2013.01); *H01L 27/249* (2013.01); *H01L 27/2436* (2013.01); *H01L 27/2481* (2013.01); *H01L 45/145* (2013.01); *H03K 19/1737* (2013.01); *H03K 19/17728* (2013.01); *H03K 19/17736* (2013.01); *H03K 19/17744* (2013.01)

(56) References Cited

U.S. PATENT DOCUMENTS

| 5,835,396 | A | 11/1998 | Zhang |
|---|---|---|---|
| 5,954,787 | A | 9/1999 | Eun |
| 7,472,149 | B2 | 12/2008 | Endo |
| 7,512,647 | B2 | 3/2009 | Wilson et al. |
| 8,564,070 | B2 | 10/2013 | Zhang |
| 9,207,910 | B2 | 12/2015 | Azadet et al. |
| 9,225,501 | B2 | 12/2015 | Azadet |
| 10,141,939 | B2 * | 11/2018 | Zhang ............. H03K 19/1776 |

OTHER PUBLICATIONS

Karam et al, "Emerging Trends in Design and Applications of Memory-Based Computing and Content-Addressable Memories", Proceedings of the IEEE, vol. 103, issue 8, pp. 1311-1330, 2015.

* cited by examiner

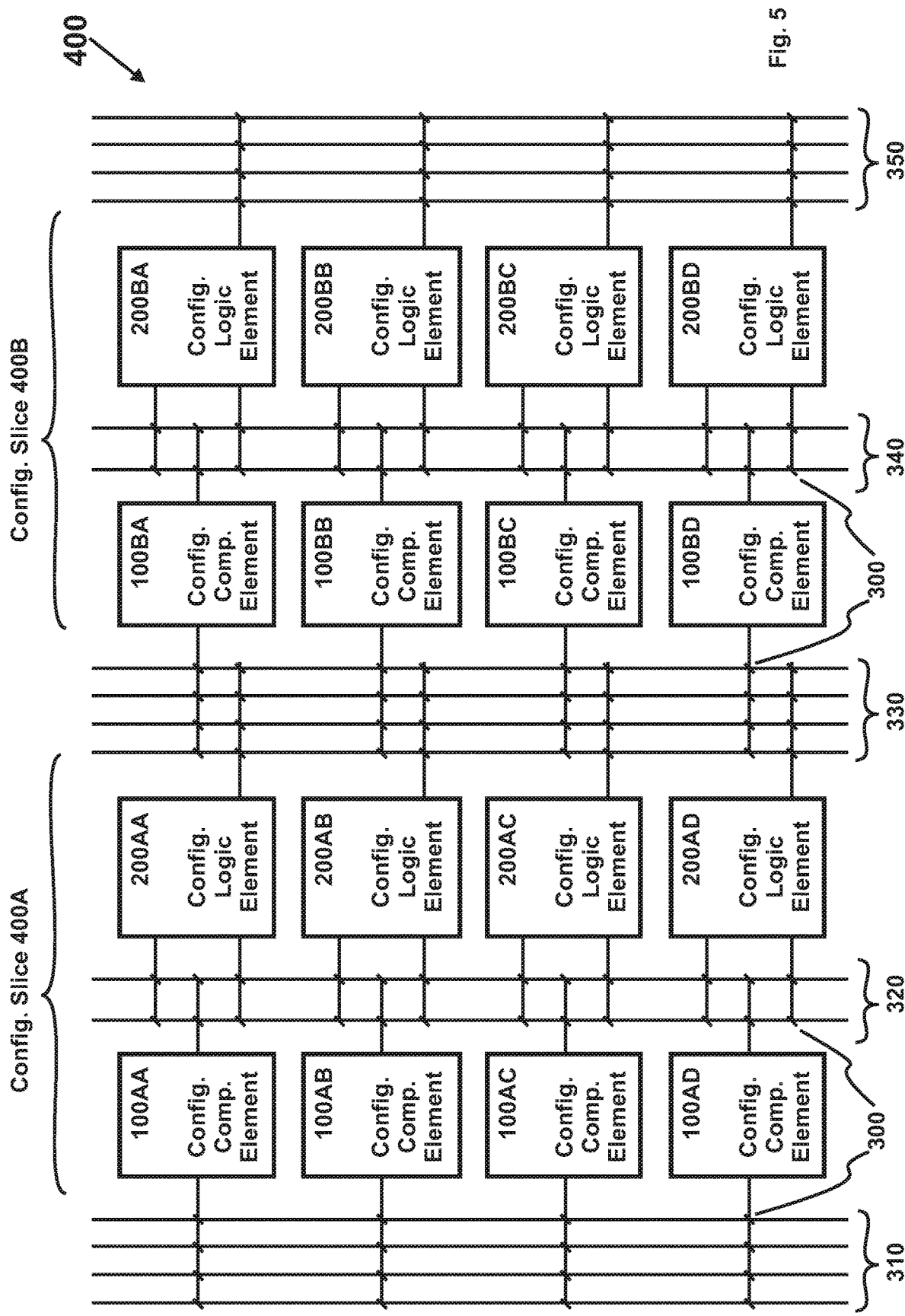

CONFIGURABLE COMPUTING ARRAY

CROSS-REFERENCE TO RELATED APPLICATIONS

This application is a continuation-in-part of U.S. patent application Ser. No. 16/059,023, filed Aug. 8, 2018, which is a continuation-in-part of U.S. Patent Applications (A)-(D):

(A) U.S. patent application Ser. No. 15/793,912, filed Oct. 25, 2017, now U.S. Pat. No. 10,075,168, issued Sep. 11, 2018;

(B) U.S. patent application Ser. No. 15/793,968, filed Oct. 25, 2017;

(C) U.S. patent application Ser. No. 15/793,927, filed Oct. 25, 2017, now U.S. Pat. No. 10,075,169, issued Sep. 11, 2018;

(D) U.S. patent application Ser. No. 15/793,933, filed Oct. 25, 2017, now U.S. Pat. No. 10,141,939, issued Nov. 27, 2018.

U.S. Patent Applications (A)-(D) are continuations-in-part of U.S. patent application Ser. No. 15/450,049, filed Mar. 6, 2017, now U.S. Pat. No. 9,838,031, issued Dec. 5, 2017, which is a continuation-in-part of U.S. patent application Ser. No. 15/450,017, filed Mar. 5, 2017, now U.S. Pat. No. 9,948,306, issued Apr. 17, 2018.

These patent applications claim priorities from Chinese Patent Application No. 201610125227.8, filed Mar. 5, 2016; Chinese Patent Application No. 201610307102.7, filed May 10, 2016; Chinese Patent Application No. 201710122749.7, filed Mar. 3, 2017; Chinese Patent Application No. 201710126067.3, filed Mar. 6, 2017; Chinese Patent Application No. 201710980620.X, filed Oct. 19, 2017; Chinese Patent Application No. 201710996864.7, filed Oct. 19, 2017; Chinese Patent Application No. 201710998652.2, filed Oct. 20, 2017; Chinese Patent Application No. 201710980817.3, filed Oct. 20, 2017; Chinese Patent Application No. 201710980779.1, filed Oct. 20, 2017; Chinese Patent Application No. 201710980813.5, filed Oct. 20, 2017; Chinese Patent Application No. 201710980826.2, filed Oct. 20, 2017; Chinese Patent Application No. 201710980967.4, filed Oct. 20, 2017; Chinese Patent Application No. 201710981043.6, filed Oct. 20, 2017; Chinese Patent Application No. 201710980989.0, filed Oct. 20, 2017; Chinese Patent Application No. 201710980827.7, filed Oct. 20, 2017; Chinese Patent Application No. 201710989881.8, filed Oct. 23, 2017; Chinese Patent Application No. 201710989901.1, filed Oct. 23, 2017, in the State Intellectual Property Office of the People's Republic of China (CN), the disclosure of which are incorporated herein by reference in their entireties.

BACKGROUND

1. Technical Field of the Invention

The present invention relates to the field of integrated circuit, and more particularly to configurable gate array.

2. Prior Art

Conventional processors use logic-based computation (LBC), which carries out computation primarily with logic circuits (e.g. XOR circuit). Logic circuits are suitable for arithmetic functions, whose operations involve only basic arithmetic operations, i.e. addition, subtraction and multiplication. However, logic circuits are not suitable for non-arithmetic functions, whose operations involve more than addition, subtraction and multiplication. Exemplary non-arithmetic functions include transcendental functions and special functions. Non-arithmetic functions are computationally hard and their hardware implementation has been a major challenge. Throughout the present invention, the term "math functions" are limited to non-arithmetic functions.

A complex math function is a non-arithmetic function with multiple independent variables (independent variable is also known as input variable or argument). It can be expressed as a combination of basic functions. A basic function is a non-arithmetic function with a single independent variable. Exemplary basic functions include basic transcendental functions, such as exponential function (exp), logarithmic function (log), trigonometric functions (sin, cos, tan, atan) and others.

On a conventional processor, the basic functions which can be calculated by hardware (i.e. hardware computing) are referred to as built-in functions. Because different math functions are implemented with different logic circuits, the hardware implementation of built-in functions is highly customized. Due to limited resources on a processor die, only a small number of built-in functions can be implemented by hardware. For example, only 7 built-in functions (i.e. CBRT, EXP, LN, SIN, COS, TAN, ATAN) are implemented by hardware on an Intel IA-64 processor (referring to Harrison et al. "The Computation of Transcendental Functions on the IA-64 Architecture", Intel Technology Journal, Q4, 1999, page 6).

Because hardware implementation of even basic functions is difficult, software computing has been a commonly accepted practice. On a conventional processor, all complex math functions, even most basic functions, are calculated by software. As software computing is more complicated than hardware computing, calculation of complex math functions is slow and inefficient. It is highly desired to realize hardware computing for complex math functions. It is even more desirable to realize configurable hardware computing, i.e. to use a same set of hardware to implement a large set of complex math functions.

A configurable gate array is a semi-custom integrated circuit designed to be configured by a customer after manufacturing. It is also referred to as field-programmable gate array (FPGA), complex programmable logic device (CPLD), or other names. U.S. Pat. No. 4,870,302 issued to Freeman on Sep. 26, 1989 (hereinafter referred to as Freeman) discloses a configurable gate array. It contains an array of configurable logic elements (also known as configurable logic blocks) and a hierarchy of configurable interconnects (also known as programmable interconnects) that allow the configurable logic elements to be wired together per customer's desire. Each configurable logic element in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each configurable interconnect can selectively couple or de-couple interconnect lines depending upon a second configuration signal.

In the conventional configurable gate array, fixed computing elements are used to implement basic functions. These fixed computing elements are portions of hard blocks which are not configurable, i.e. the circuits implementing these math functions are fixedly connected and are not subject to change by programming. This would limit further application of the configurable gate array. To overcome these difficulties, the present invention expands the original concept of the configurable gate array by making the fixed computing elements configurable. In other words, besides configurable logic elements, the configurable gate array comprises configurable computing elements, which can realize any one of a plurality of math functions.

Objects and Advantages

It is a principle object of the present invention to extend the concept of the configurable gate array from logic computation to math computation.

It is a further object of the present invention to provide a configurable computing array to customize not only logic functions, but also math functions.

It is a further object of the present invention to provide a configurable computing array with a small physical size.

It is a further object of the present invention to provide a configurable computing array with a fast computational speed.

It is a further object of the present invention to provide a configurable computing array with a short time-to-market.

It is a further object of the present invention to provide a configurable computing array with a good manufacturability.

It is a further object of the present invention to provide a configurable computing array with a lower manufacturing cost.

In accordance with these and other objects of the present invention, the present invention discloses a configurable computing array.

SUMMARY OF THE INVENTION

The present invention discloses a configurable computing array. It comprises at least an array of configurable interconnects, at least an array of configurable logic elements and at least an array of configurable computing elements. Each configurable computing element comprises at least a programmable memory, which can be loaded with a look-up table (LUT) for a math function. Because the memory is programmable, the math functions that can be realized by the configurable computing element are essentially boundless and numerous.

The usage cycle of the configurable computing element comprises two stages: a configuration stage and a computation stage. In the configuration stage, the LUT for a desired math function is loaded into the programmable memory. In the computation stage, a selected portion of the LUT for the desired math function is read out from the programmable memory. For a rewritable memory, a configurable computing element can be re-configured to realize different math functions at different time.

Besides configurable computing elements, the preferred configurable computing array further comprises configurable logic elements and configurable interconnects. During operation, a complex math function is first decomposed into a combination of basic functions. Each basic function is realized by programming an associated configurable computing element. The complex math function is then realized by programming the appropriate configurable logic elements and configurable interconnects.

By using arrays of configurable computing elements, configurable logic elements and configurable interconnects, the present invention implements hardware computing of complex math functions. Compared with software computing, hardware computing is much faster and more efficient. Moreover, because the LUTs are used as a primary means to implement math functions, this type of computing is a memory-based computing (MBC). The best advantage of MBC over LBC is configurability and generality. By loading the LUTs of different math functions into the programmable memory at different time, a single programmable memory can be used to implement a large set of basic functions, thus realizing configurable computing.

Accordingly, the present invention discloses a configurable computing array, comprising: at least an array of configurable logic elements including a configurable logic element, wherein said configurable logic element selectively realizes a logic function from a logic library; and at least an array of configurable computing elements including first and second configurable computing elements, wherein said first configurable computing element comprises a first memory for storing a first look-up table (LUT) for a first math function; and, said second configurable computing element comprises a second memory for storing a second LUT for a second math function; whereby said configurable computing array realizes a math function by programming said configurable logic elements and said configurable computing elements, wherein said math function is a combination of at least said first and second math functions.

The present invention further discloses another configurable computing array, comprising: at least an array of configurable interconnects including a configurable interconnect, wherein said configurable interconnect selectively realizes an interconnect from an interconnect library; and at least an array of configurable computing elements including first and second configurable computing elements, wherein said first configurable computing element comprises a first memory for storing a first look-up table (LUT) for a first math function; and, said second configurable computing element comprises a second memory for storing a second LUT for a second math function; whereby said configurable computing array realizes a math function by programming said configurable interconnects and said configurable computing elements, wherein said math function is a combination of at least said first and second math functions.

The present invention further discloses yet another configurable computing array, comprising: at least an array of configurable interconnects including a configurable interconnect, wherein said configurable interconnect selectively realizes an interconnect from an interconnect library; at least an array of configurable logic elements including a configurable logic element, wherein said configurable logic element selectively realizes a logic function from a logic library; and at least an array of configurable computing elements including first and second configurable computing elements, wherein said first configurable computing element comprises a first memory for storing a first look-up table (LUT) for a first math function; and, said second configurable computing element comprises a second memory for storing a second LUT for a second math function; whereby said configurable computing array realizes a math function by programming said configurable interconnects, said configurable logic elements and said configurable computing elements, wherein said function is a combination of at least said first and second math functions.

BRIEF DESCRIPTION OF THE DRAWINGS

FIG. 5 is a circuit block diagram of a first preferred configurable computing array;

Figure 1:
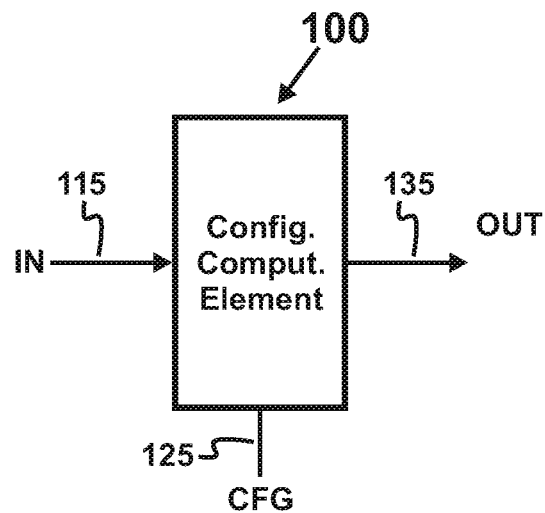
FIG. 1 discloses a symbol representing a preferred configurable computing element.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. In the present invention, the terms "write", "program" and "configure" have similar meanings and are used interchangeably. The symbol "I" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Referring now to FIG. 1, a symbol representing a preferred configurable computing element 100 is shown. The input port IN includes input data 115, the output port OUT includes output data 135, and the configuration port CFG includes at least a configuration signal 125. When the configuration signal 125 is "write", the look-up table (LUT) for a desired math function is loaded into the configurable computing element 100; when the configuration signal 125 is "read", a selected portion of the LUT is read out from the configurable computing element 100.

Figure 2:
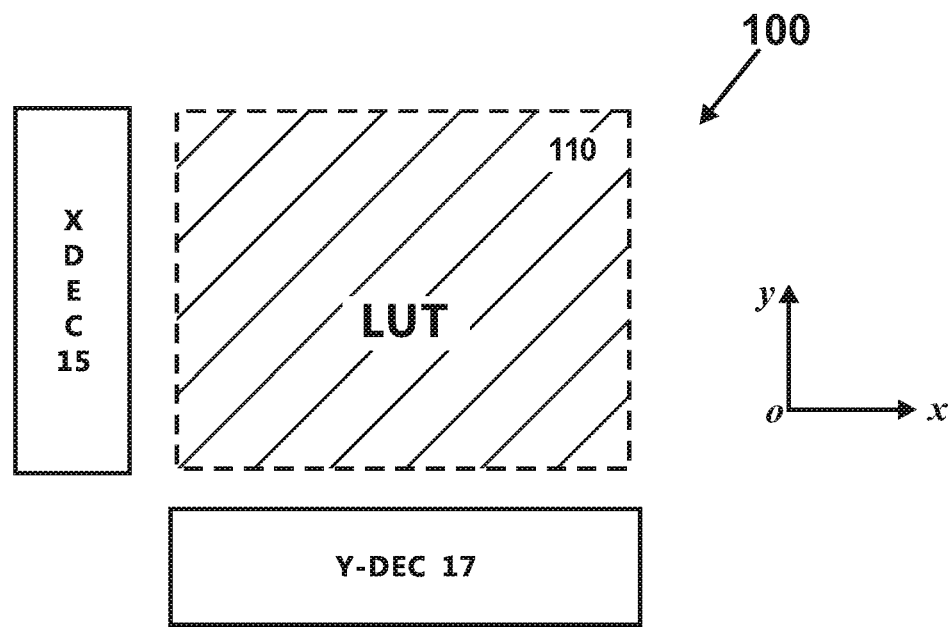
FIG. 2 is a layout view of the preferred configurable computing element.

FIG. 2 is a layout view of the preferred configurable computing element 100. The LUT is stored in at least a memory array 110. The configurable computing element 100 further includes the X decoder 15 and Y decoder (including read-out circuit such as sense amplifier) 17 of the memory array 110. The memory array 110 is preferably a programmable memory. It could be a RAM array or a ROM array. Exemplary RAM includes SRAM, DRAM, etc. On the other hand, exemplary ROM includes OTP (one-time-programmable) and MTP (multiple-time-programmable, including re-programmable) memories, etc. Among them, the MTP further includes EPROM, EEPROM, flash memory, 3-D writable memory (e.g. 3D-NAND, 3D-XPoint) and others, etc.

The implementation of math functions is much more complicated than the implementation of logic functions. The LUT stored in the configurable computing element 100 includes numerical values related to a math function, whereas the LUT stored in a configurable logic element of the conventional configurable gate array includes logic values of a logic function. Numerical values are denoted by a large number of bits. For example, a half-precision floating-point number comprises 16 bits; a single-precision floating-point number comprises 32 bits; a double-precision floating-point number comprises 64 bits. In comparison, the logic values can be denoted by a single bit and have only two values, i.e. "true" and "false". Accordingly, the LUT size in the configurable computing element 100 is substantially larger than that in the configurable logic element.

In an LUT, the numerical values related to a math function include the functional values of the math function. When the input variable of a math function comprises a larger number of bits, the LUT size could become excessively large. For example, an LUT including the functional values of a double-precision math function needs $2^{64*}64=10^{21}$ bits. To reduce the LUT size, Taylor-series (or other polynomial expansion) calculation is preferably used. To be more specific, the LUT not only includes the functional values, but also includes the derivative values of a math function, e.g. the first-order derivative values, the second-order derivative values, and so on. To perform the Taylor-series calculation, the configurable computing element 100 further comprises at least an adder and a multiplier. More details on Taylor-series implementation of math functions are disclosed in a co-pending U.S. patent application Ser. No. 15/487,366, filed Apr. 13, 2017.

Figure 3:
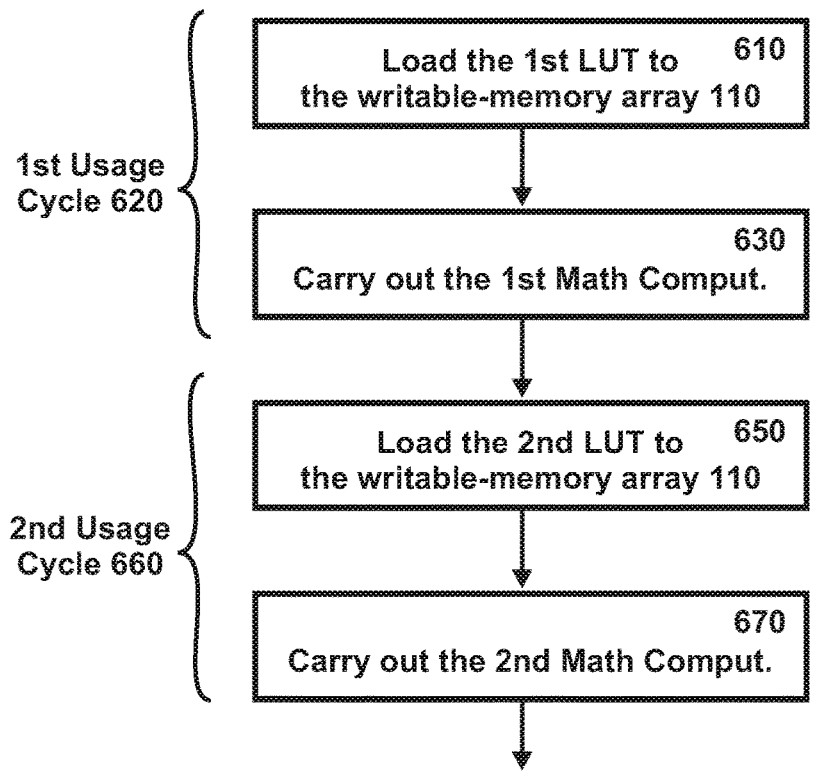
FIG. 3 discloses two usage cycles of a preferred reconfigurable computing element.

Referring now to FIG. 3, two usage cycles 620, 660 of a preferred re-configurable computing element 100 are shown. For the re-configurable computing element 100, the memory array 110 is re-programmable. The first usage cycle 620 includes two stages: a configuration stage 610 and a computation stage 630. In the configuration stage 610, the LUT for a first desired math function is loaded into the memory array 110. In the computation stage 630, a selected portion of the LUT for the first desired math function is read out from the memory array 110. Being re-programmable, the re-configurable computing element 100 can realize different math functions during different usage cycles 620, 660. During the second usage cycle 660 (including a configuration stage 650 and a computation stage 670), the LUT for a second desired math function is loaded and later read out. The re-configurable computing element 100 is particularly suitable for single-instruction-multiple-data (SIMD)-type of data processing. Once the LUTs are loaded into the memory arrays 110 in the configuration stage, a large amount of data can be fed into the re-configurable computing element 100 and processed at high speed. SIMD has many applications, e.g. vector processing in image processing, massively parallel processing in scientific computing.

Figure 4A:
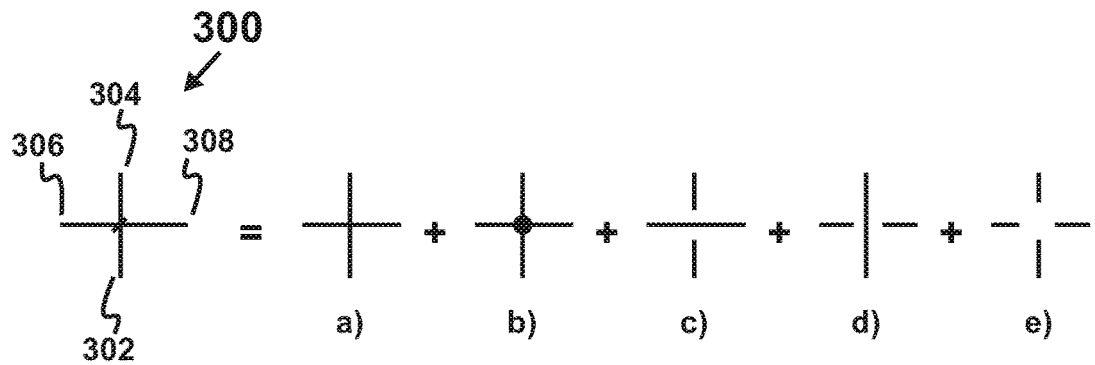
FIG. 4A shows an interconnect library supported by a preferred configurable interconnect.
Figure 4B:
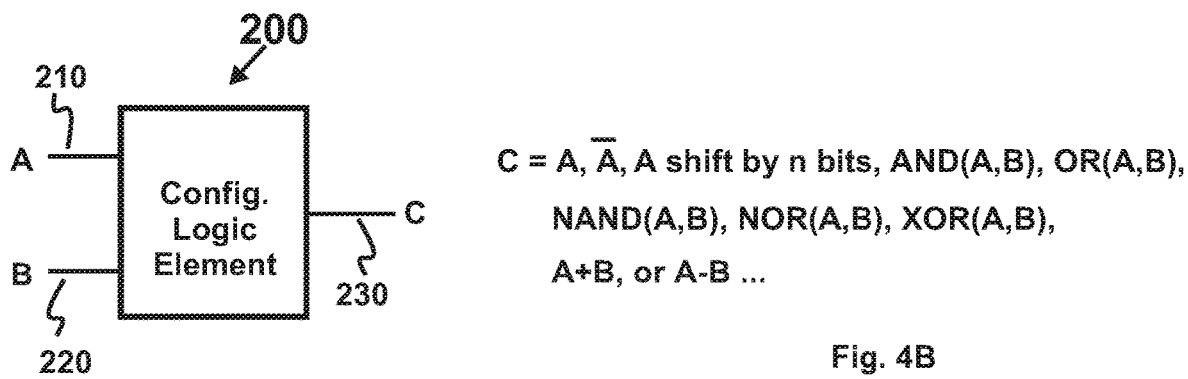
FIG. 4B shows a logic library supported by a preferred configurable logic element.

Referring now to FIGS. 4A-4B, an interconnect library and a logic library are shown. FIG. 4A shows an interconnect library supported by a preferred configurable interconnect 300. An interconnect library is a collection of all interconnects supported by a configurable interconnect. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the configurable interconnects are disclosed in Freeman.

FIG. 4B shows a logic library supported by a preferred configurable logic element 200. A logic library is a collection of all logic functions supported by a configurable logic element. In this preferred embodiment, the inputs A and B include input data 210, 200, and the output C includes the output data 230. The logic library includes the following logic functions: C=A, NOT A, A shift by n bits, AND(A,B), OR(A,B), NAND(A,B), NOR(A,B), XOR(A,B), A+B, A−B. To facilitate pipelining, the configurable logic element 200 may comprise sequential logic such as flip-flops and registers. More details on the configurable logic elements are disclosed in Freeman.

Referring now to FIG. 5, a first preferred configurable computing array 400 is disclosed. It comprises first and second configurable slices 400A, 400B. Each configurable slice (e.g. 400A) comprises a first array of configurable computing elements (e.g. 100AA-100AD) and a second array of configurable logic elements (e.g. 200AA-200AD). A configurable channel 320 is placed between the first array of configurable computing elements (e.g. 100AA-100AD) and the second array of configurable logic elements (e.g. 200AA-200AD). The configurable channels 310, 330, 350 are also placed between different configurable slices 300A, 300B. Each configurable channel (e.g. 310) comprise an array of configurable interconnects 300. For those skilled in the art, besides configurable channels, the sea-of-gates architecture may also be used.

Figure 6:
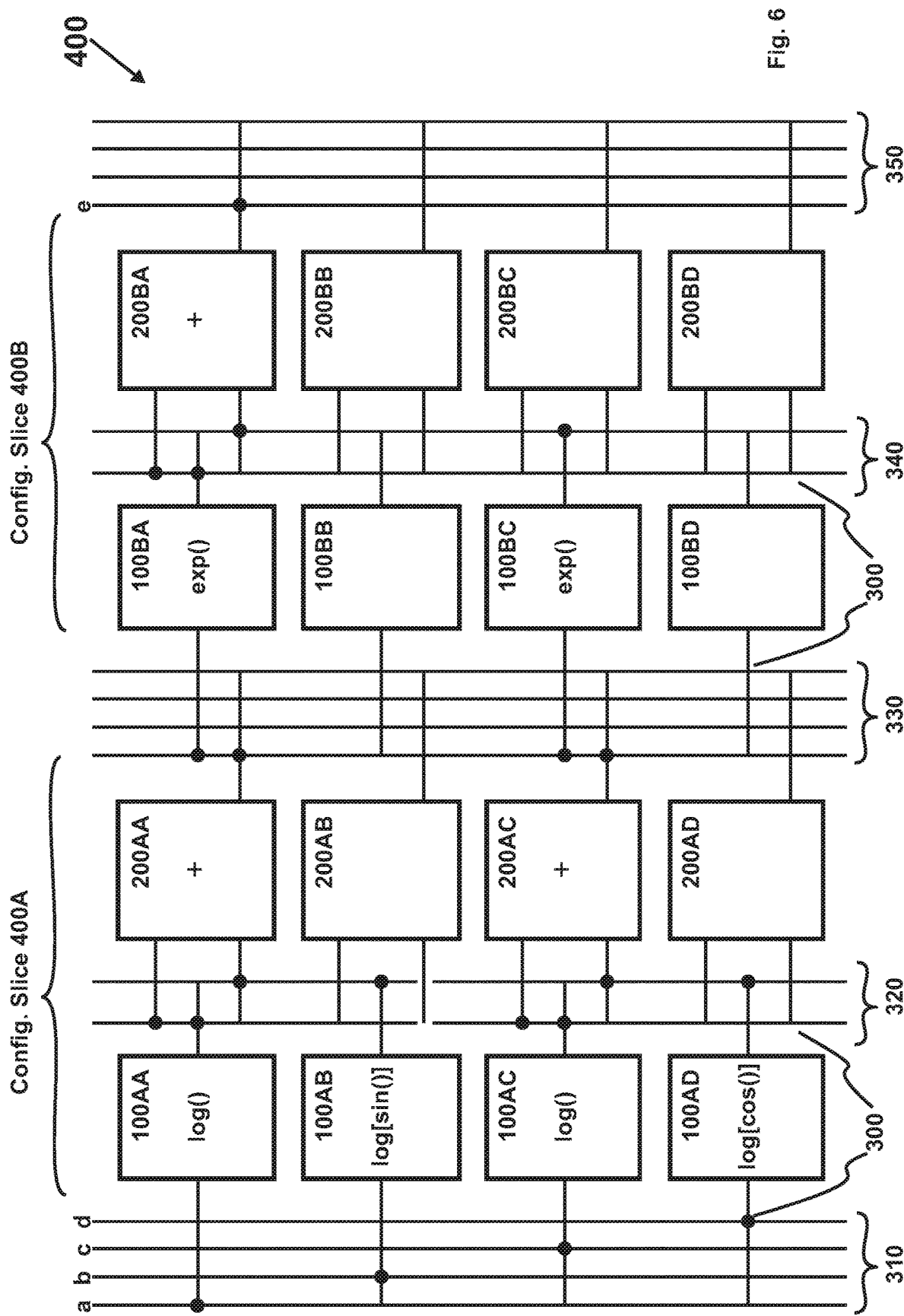
FIG. 6 shows an instantiation of the first preferred configurable computing array.

FIG. 6 discloses an instantiation of the first preferred configurable computing array implementing a complex math function e=a·sin(b)+c·cos(d). The configurable interconnects 300 in the configurable channel 310-350 use the same convention as FIG. 4A: the interconnects with dots mean that the interconnects are connected; the interconnects without dots mean that the interconnects are not connected; a broken interconnect means that two broken sections are disconnected. In this preferred implementation, the configurable channel 310 is configured in such a way that the inputs a, b, c, d associated with four independent variables of the complex math function e=a·sin(b)+c·cos(d) are coupled to the inputs of the configurable computing elements 100AA-100AD, respectively. Furthermore, the configurable computing element 100AA is configured to realize the function log( ), whose result log(a) is sent to a first input of the configurable logic element 200A. The configurable computing element 100AB is configured to realize the function log[sin( )], whose result log[sin(b)] is sent to a second input of the configurable logic element 200A. The configurable logic element 200A is configured to realize arithmetic addition "+", whose result log(a)+log[sin(b)] is sent the configurable computing element 100BA. The configurable computing element 100BA is configured to realize the function exp( ), whose result exp{log(a)+log[sin(b)]}=a·sin(b) is sent to a first input of the configurable logic element 200BA. Similarly, through proper configurations, the results of the configurable computing elements 100AC, 100AD, the configurable logic elements 200AC, and the configurable computing element 100BC can be sent to a second input of the configurable logic element 200BA. The configurable logic element 200BA is configured to realize arithmetic addition "+", whose result a·sin(b)+c·cos(d) is sent to the output e. Apparently, by changing its configuration, the configurable computing array 400 can realize other complex math functions.

Figure 7:
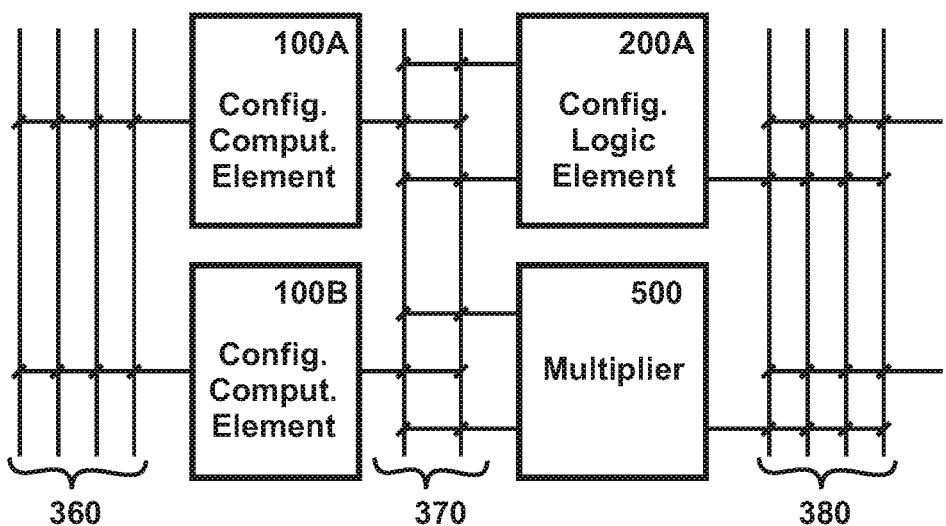
FIG. 7 is a circuit block diagram of a second preferred configurable computing array.

Referring now to FIG. 7, a second preferred configurable computing array 400 is shown. Besides configurable computing elements 100A, 100B and configurable logic element 200A, this preferred embodiment further comprises a multiplier 500. The configurable channels 360-380 comprise a plurality of configurable interconnects. With the addition of the multiplier 500, the preferred configurable computing array 400 can realize more math functions and its computational power becomes more powerful.

Figure 8A:
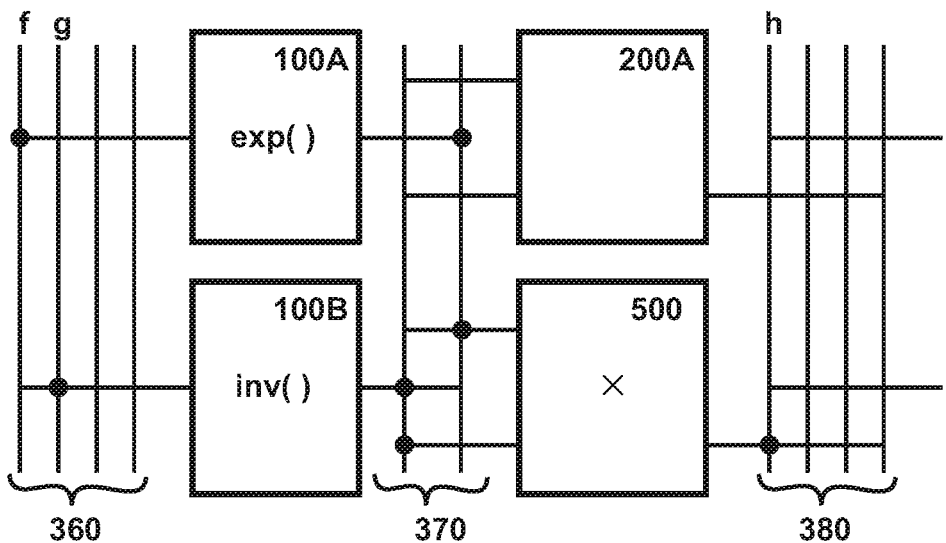
FIGS. 8A-8B show two instantiations of the second preferred configurable computing array.
Figure 8B:
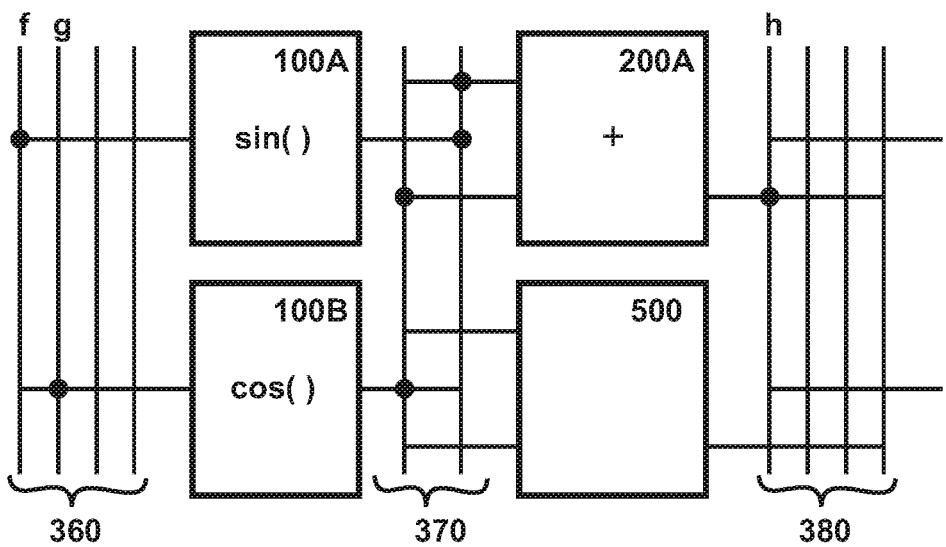

FIGS. 8A-8B disclose two instantiations of the second preferred configurable computing array 400. In the instantiation of FIG. 8A, the configurable computing element 100A is configured to realize the function exp(f), while the configurable computing element 100B is configured to realize the function inv(g). The configurable channel 370 is configured in such a way that the outputs of 100A, 100B are fed into the multiplier 500. The final output is then h=exp(f)*inv(g). On the other hand, in the instantiation of FIG. 8B, the configurable computing element 100A is configured to realize the function sin(f), while the configurable computing element 100B is configured to realize the function cos(g). The configurable channel 370 is configured in such a way that the outputs of 100A, 100B are fed into the configurable logic element 200A, which is configured to realize arithmetic addition. The final output is then h=sin(f)+cos(g).

The preferred configurable computing array 400 can be constructed in many ways. In one preferred embodiment, the preferred configurable computing array 400 is a single-level configurable computing array, wherein the configurable computing elements 100 and the configurable logic elements 200 are disposed on a same physical level. Accordingly, the present invention discloses a preferred single-level configurable computing array.

Figure 9:
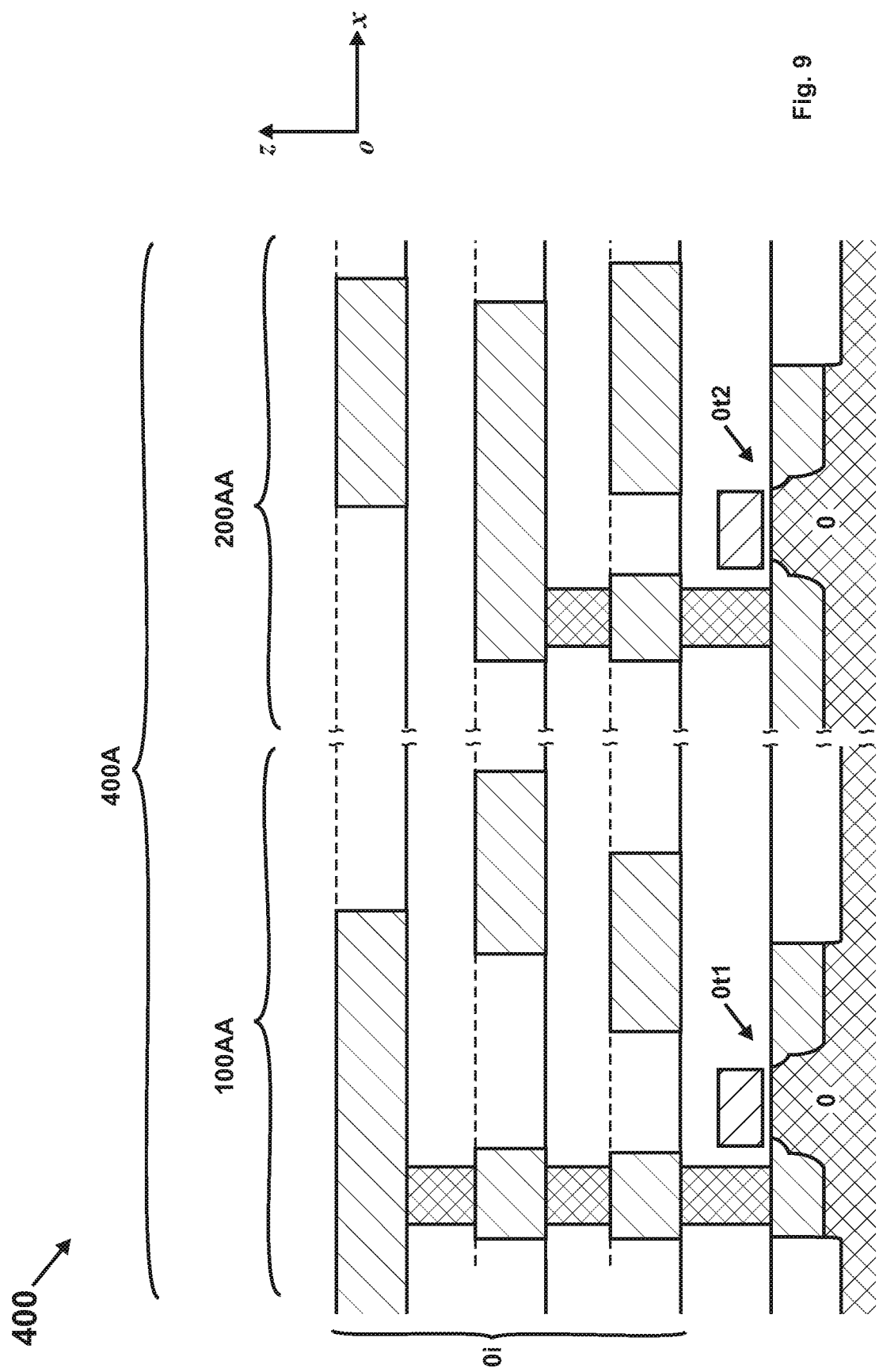
FIG. 9 is a cross-sectional view of a preferred configurable computing-array die.

FIG. 9 discloses a preferred single-level configurable computing array, which is a configurable computing-array die 400. It is a monolithic integrated circuit comprising regularly placed configurable slices 400A . . . The configurable slice 400A comprises configurable computing element 100AA . . . and configurable logic element (or, configurable interconnects) 200AA . . . The memory array in the configurable computing element 100AA comprises a memory transistor 0t1. The logic circuit in the configurable logic element 200AA comprises a logic transistor 0t2. Both the memory transistor 0t1 and the logic transistor 0t2 are formed on the front surface of a semiconductor substrate 0 and placed side-by-side. They are coupled through interconnects 0i. Because all transistors 0t1, 0t2 are disposed on a 2-D plane, this type of integration is referred to as 2-D integration; and, the preferred single-level configurable computing array is also referred to as 2-D integrated configurable computing array.

Figure 12A:
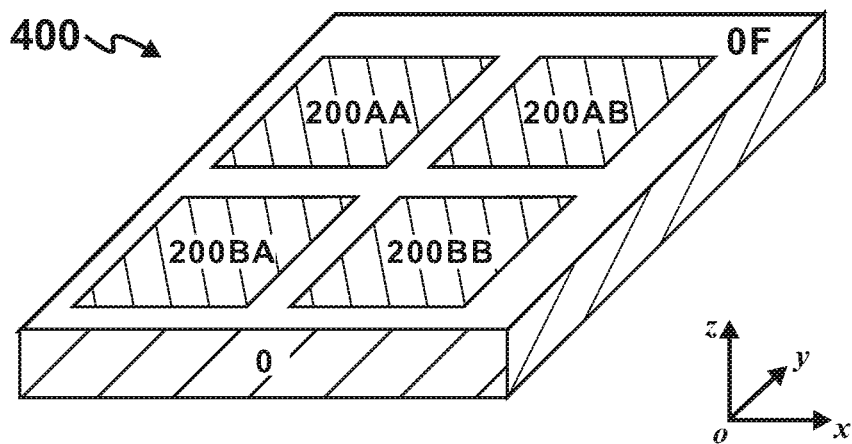
FIG. 12A is a perspective view of a front side of a preferred configurable computing-array die using two-sided integration.
Figure 12B:
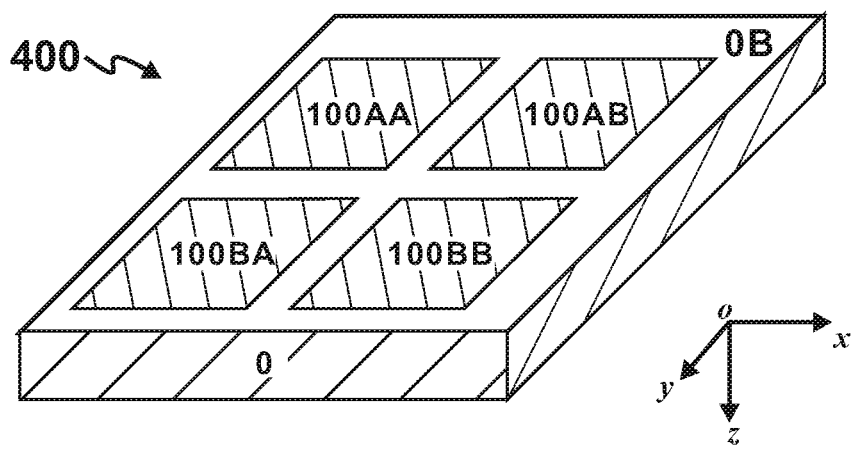
FIG. 12B is a perspective view of a back side of the preferred configurable computing-array die using the two-sided integration.
Figure 12C:
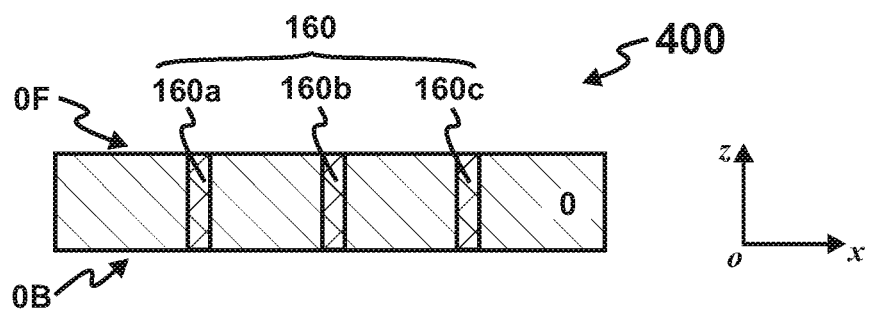
FIG. 12C is a cross-sectional view of the preferred configurable computing-array die using the two-sided integration.
Figure 13:
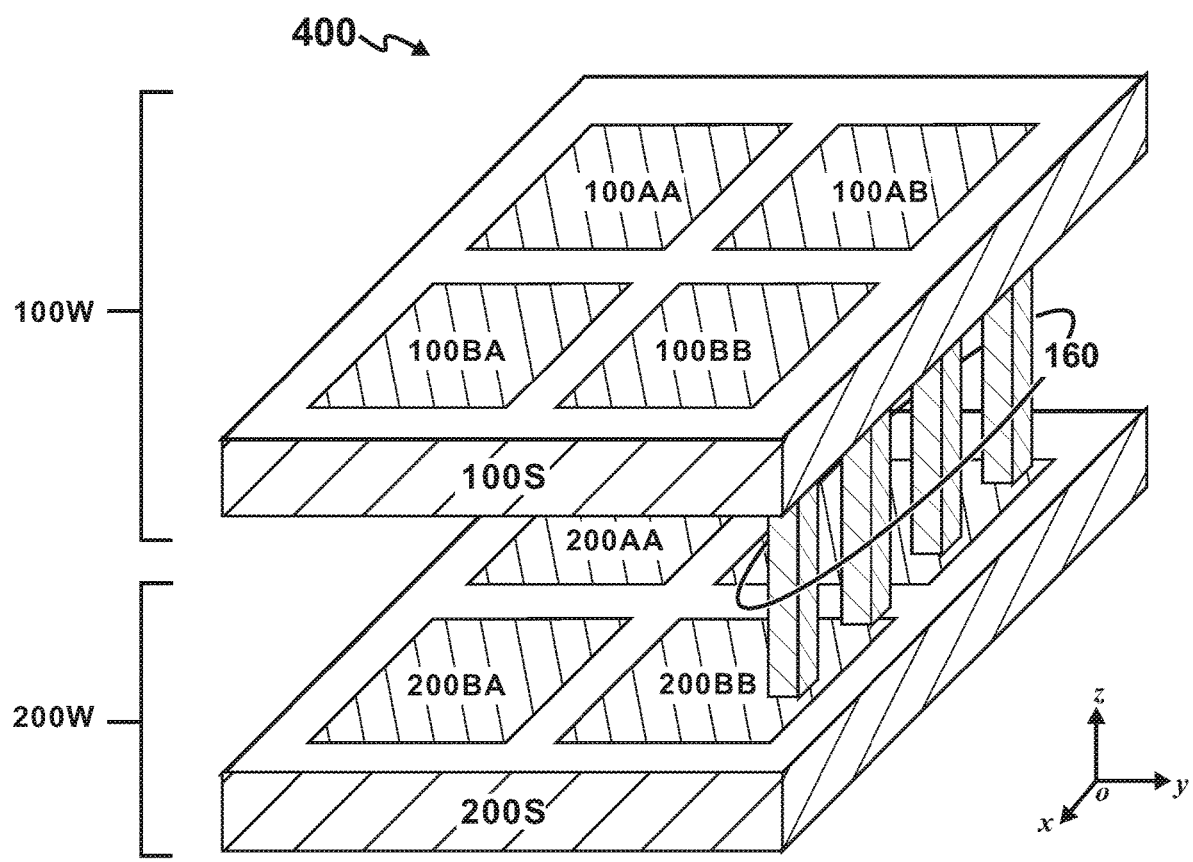
FIG. 13 is a perspective view of a preferred configurable computing-array package.

Alternatively, the preferred configurable computing array 400 is a multi-level configurable computing array, wherein the configurable computing elements 100 and the configurable logic elements 200 are disposed on different physical levels. To be more specific, the memory cells of the configurable computing elements 100 are disposed on at least a memory level, the transistors of the configurable logic elements 200 are disposed on at least a logic level, and the memory level and the logic level are different physical levels. In one preferred example, both the memory cells and the transistors are disposed on the same side of a same semiconductor substrate, but the memory cells are stacked above the transistors (FIGS. 10A-11B). In another preferred example, the configurable computing elements 100 and the configurable logic elements 200 are disposed on different sides of a semiconductor substrate (FIGS. 12A-12C). In yet another preferred example, the configurable computing elements 100 and the configurable logic elements 200 are disposed on different dice of a same package (FIGS. 13-14C). Because all active elements are disposed in a 3-D space, this type of integration is referred to as 3-D integration; and, the multi-level configurable computing array is also referred to as 3-D integrated configurable computing array.

Comparing with the single-level configurable computing array, the multi-level configurable computing array offers many advantages. First of all, because the memory cells are disposed on a separate memory level(s), the memory level(s) can be dedicated to the LUT storage. As a result, the memory level(s) has a large storage density and therefore, can be used to store a large LUT (for better precision) or more LUTs (for more math functions). Secondly, because they are formed on a separate logic level, the configurable logic elements would have a small footprint. This leads to smaller die size. Thirdly, because the configurable computing elements are disposed above (or, below) the configurable logic elements, the connections coupling the configurable computing elements and the configurable logic elements are relatively short. This leads to a fast speed.

Referring now to FIGS. 10A-11B, several preferred multi-level configurable computing arrays based on three-dimensional memory (3D-M), more particularly three-dimensional writable memory (3D-W), are disclosed. The preferred configurable computing array is a monolithic integrated circuit comprising a configurable computing element 100 and a configurable logic element 200. The configurable computing element 100 comprises at least a 3D-M array. In the 3D-M array, its memory cells are disposed in a three-dimensional space, i.e. the memory cells are vertically stacked above each other. The 3D-W is a type of 3D-M whose memory cells are electrically programmable. Based on the number of programming allowed, the 3D-W can be categorized into three-dimensional one-time-programmable memory (3D-OTP) and three-dimensional multiple-time-programmable memory (3D-MTP). Types of the 3D-MTP cell include flash-memory cell, memristor, resistive random-access memory (RRAM or ReRAM) cell, phase-change memory (PCM) cell, programmable metallization cell (PMC), conductive-bridging random-access memory (CBRAM) cell, and the like.

Based on the orientation of the memory cells, the 3D-M can be categorized into horizontal 3D-M (3D-$M_H$) and vertical 3D-M (3D-Mv). In a 3D-$M_H$, all address lines are horizontal and the memory cells form a plurality of horizontal memory levels which are vertically stacked above each other. A well-known 3D-$M_H$ is 3D-XPoint. In a 3D-Mv, at least one set of the address lines are vertical and the memory cells form a plurality of vertical memory strings which are placed side-by-side on/above the substrate. A well-known 3D-Mv is 3D-NAND. In general, the 3D-$M_H$ (e.g. 3D-XPoint) is faster, while the 3D-$M_v$ (e.g. 3D-NAND) is denser.

Figure 10A:
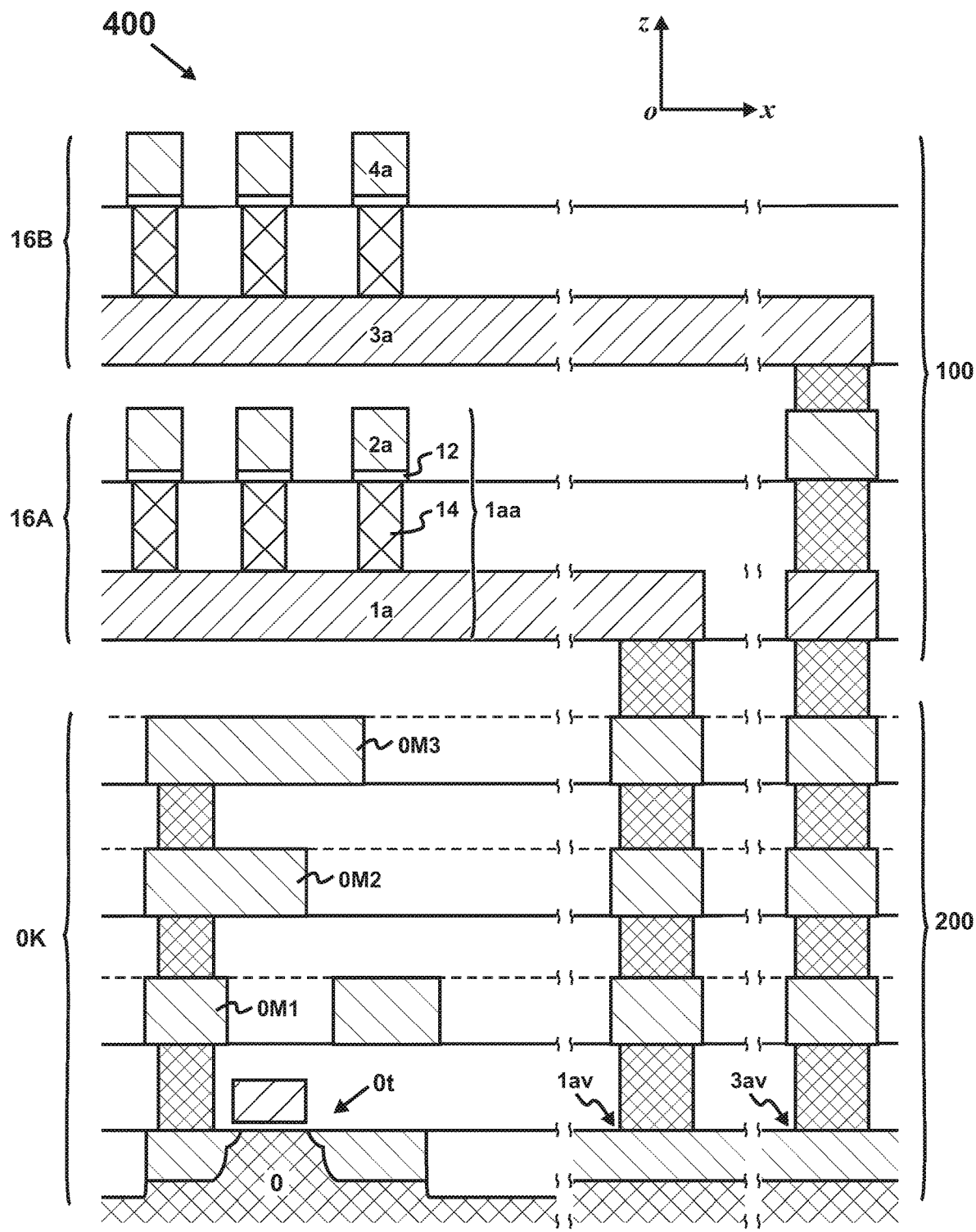
FIG. 10A is a cross-sectional view of a preferred configurable computing array based on three-dimensional memory (3D-M)

The preferred 3D-M in FIG. 10A is a 3D-$M_H$. It comprises a substrate circuit 0K formed on the substrate 0. A first memory level 16A is stacked above the substrate circuit 0K, with a second memory level 16B stacked above the first memory level 16A. The substrate circuit 0K includes the peripheral circuits of the memory levels 16A, 16B. It comprises transistors 0t and the associated interconnects 0M1-0M3. Each of the memory levels (e.g. 16A, 16B) comprises a plurality of first address-lines (i.e. y-lines, e.g. 2a, 4a), a plurality of second address-lines (i.e. x-lines, e.g. 1a, 3a) and a plurality of 3D-M cells (e.g. 1aa, 2aa). The first and second memory levels 16A, 16B are coupled to the substrate circuit 0K through contact vias 1av, 3av, respectively.

The 3D-M cell 1aa comprises a programmable layer 12 and a diode layer 14. The programmable layer 12 could be an OTP layer (e.g. an antifuse layer, used for the 3D-OTP) or an MTP layer (e.g. a phase-change layer, used for the 3D-MTP). The diode layer 14 (also referred to as selector layer, a quasi-conduction layer or other names) is broadly interpreted as any layer whose resistance at the read voltage is substantially lower than the case when the applied voltage has a magnitude smaller than or polarity opposite to that of the read voltage. The diode could be a semiconductor diode (e.g. p-i-n silicon diode), or a metal-oxide (e.g. $TiO_2$) diode. In some embodiments, the programmable layer 12 and the diode layer 14 are merged into a single layer.

Figure 10B:
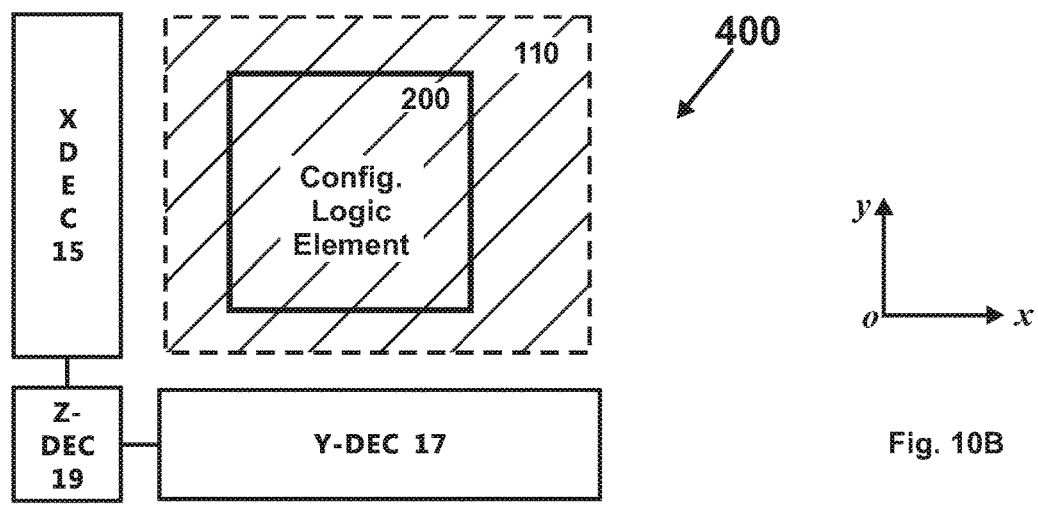
FIG. 10B is a substrate layout view of the preferred configurable computing array.

FIG. 10B is a substrate layout view of the preferred configurable computing array 400. Because the 3D-M arrays are stacked above the substrate 0K and not located in the substrate 0, their projections on the substrate 0, not the 3D-M arrays themselves, are shown in the areas enclosed by dash lines. In this preferred embodiment, the LUT is stored in at least a 3D-M array 110. The substrate circuit 0K includes the decoders 15, 17, 19 of the 3D-M array 110, as well as a configurable logic element 200 and/or a configurable interconnect 300 (not shown in the figure). To save the die area, the 3D-M array 110 can be stacked above and at least partially cover the configurable logic element 200. Similarly, the 3D-M array 110 can be stacked above and at least partially cover the configurable interconnect 300.

Figure 10C:
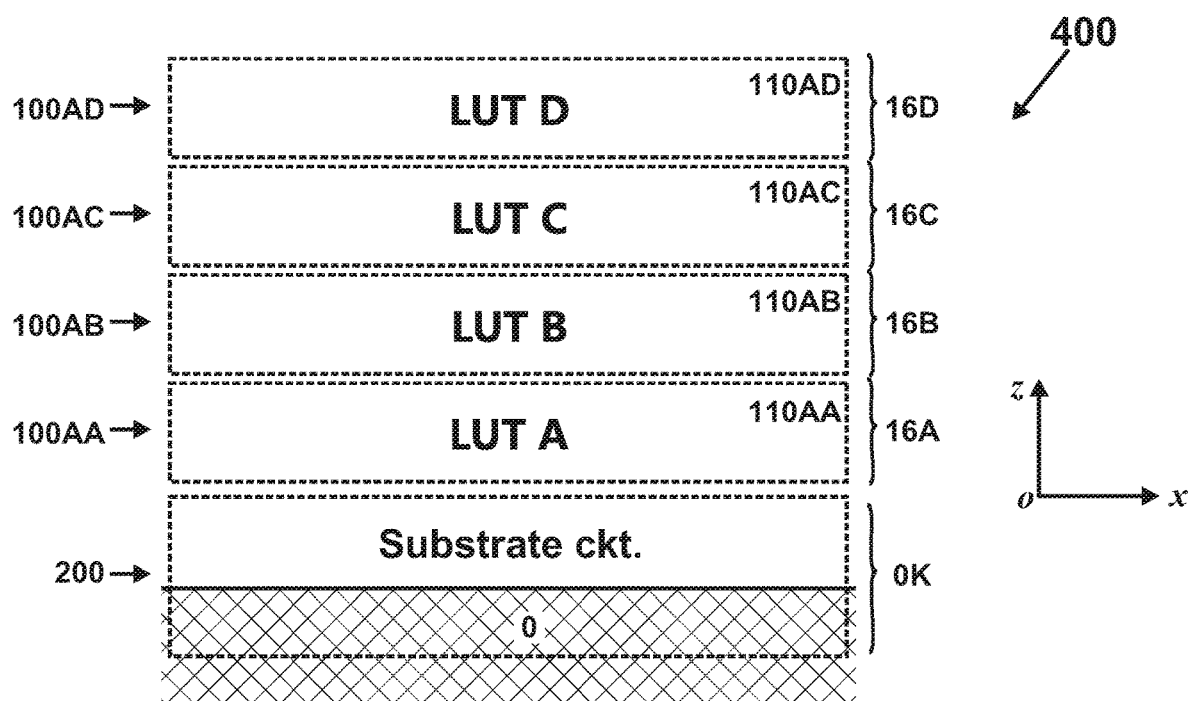
FIG. 10C is a cross-sectional view of a preferred configurable computing array based on a four-level 3D-M.

FIG. 10C is a cross-sectional view of a preferred configurable computing array based on a four-level 3D-M. This implementation corresponds to the configurable slice 400A of FIG. 5. For the configurable computing elements 100AA-100AD, their 3D-M arrays 110AA-110AD are vertically stacked. To be more specific, the substrate circuit 0K comprises the configurable logic elements 200 (including 200AA-200AD); the 3D-M array 110AA for the configurable computing element 100AA (storing the LUT A for a first math function) is disposed in the first memory level 16A and stacked above the substrate 0K (along the +Z direction), the 3D-M array 110AB for the configurable computing element 100AB (storing the LUT B for a second math function) is disposed in the second memory level 16B and stacked above the 3D-M array 110AA (along the +Z direction), the 3D-M array 110AC for the configurable computing element 100AC (storing the LUT C for a third math function) is disposed in the third memory level 16C and stacked above the 3D-M array 110AB (along the +Z direction), and the 3D-M array 110AD for the configurable computing element 100AD (storing the LUT D for a fourth math function) is disposed in the fourth memory level 16D and stacked above the 3D-M array 110AC (along the +Z direction). Apparently, stacking the 3D-M arrays 110AA-110AD for multiple configurable computing elements 100AA-100AD would save substantial die area and lead to a compact configurable computing array 400.

Figure 11A:
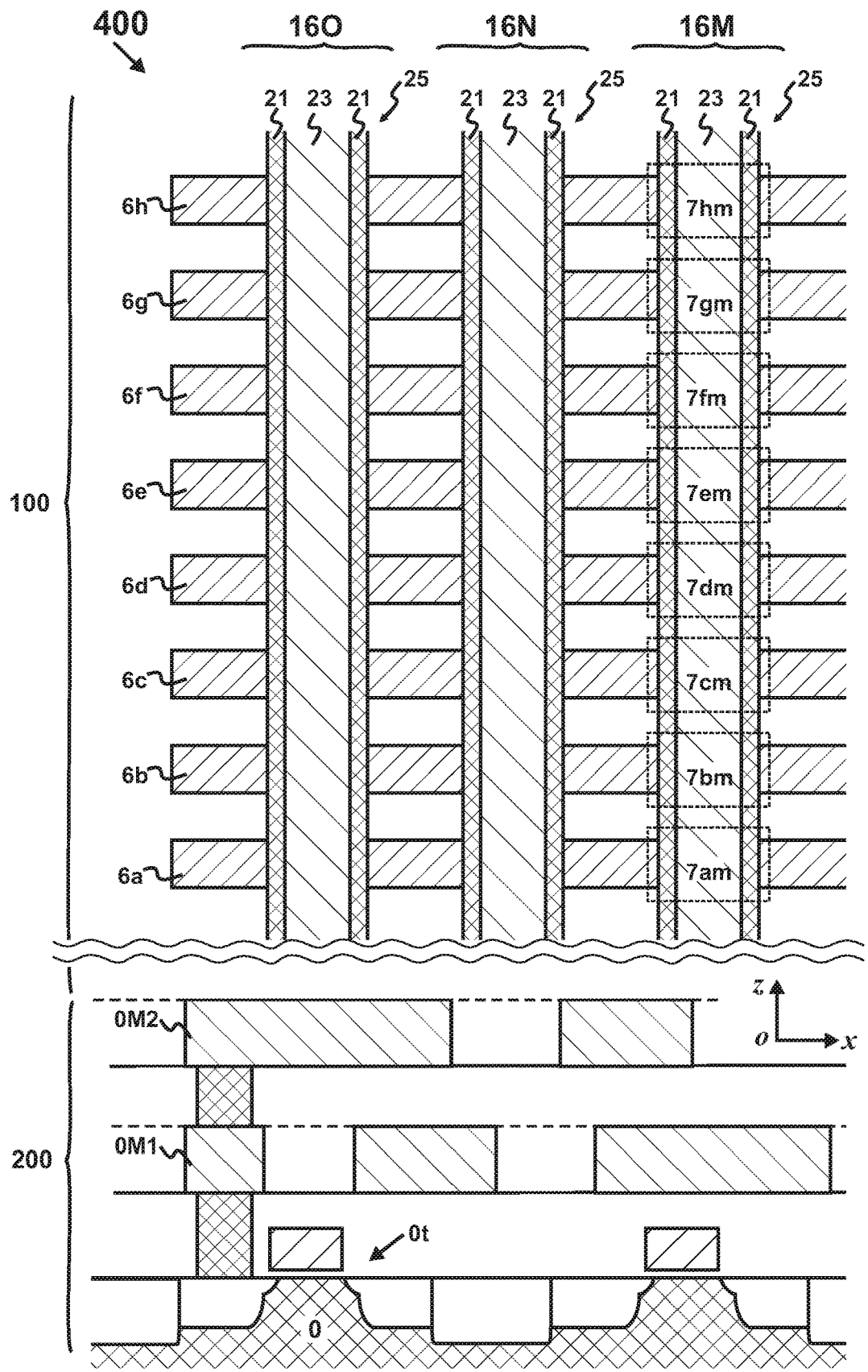
FIGS. 11A-11B are cross-sectional views of two preferred configurable computing array based on three-dimensional vertical memory (3D-$M_V$)
Figure 11B:
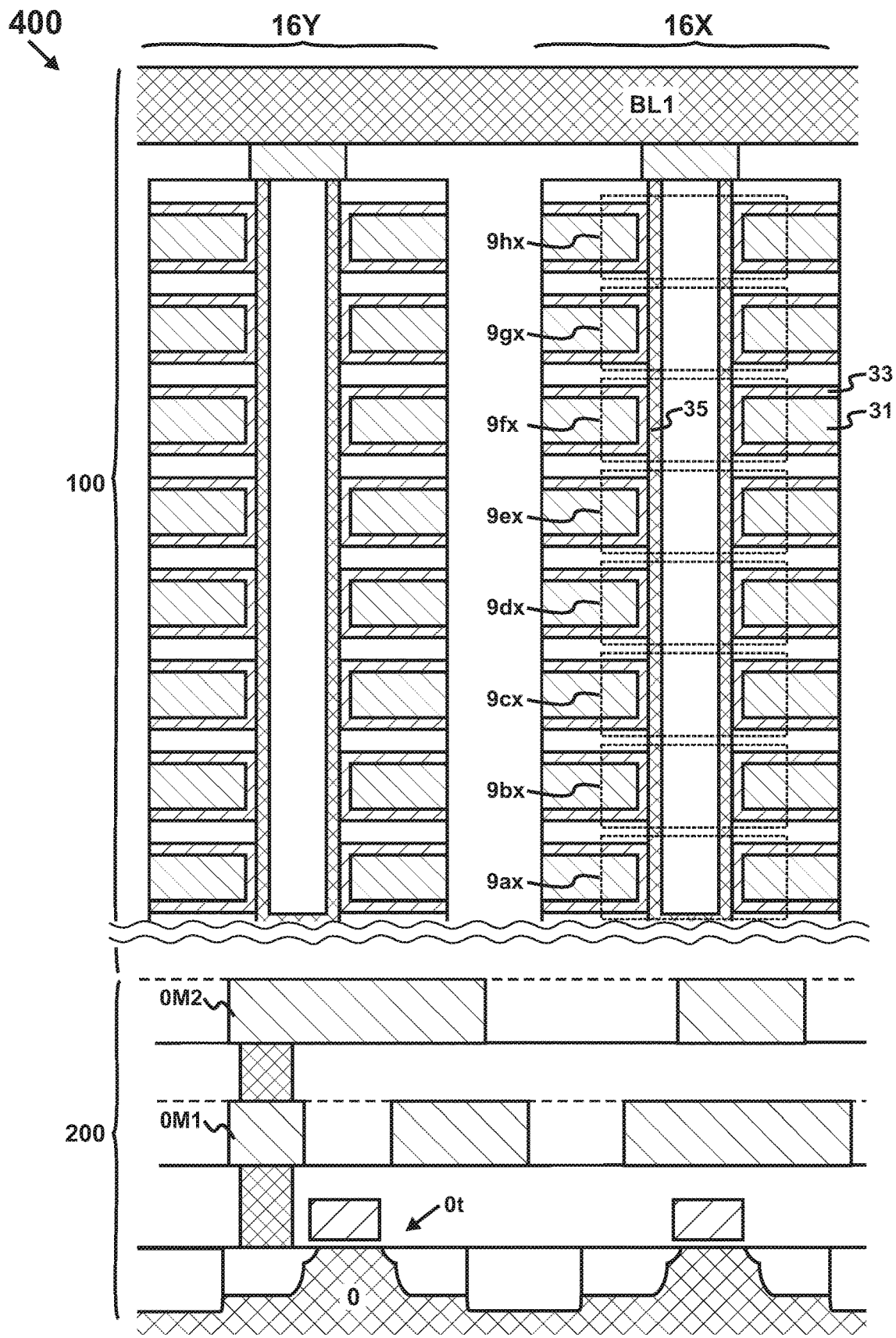

FIGS. 11A-11B are cross-sectional views of two preferred configurable computing array 400 based on 3D-$M_V$. It is a monolithic integrated circuit comprising a configurable computing element 100 and a configurable logic element 200. The configurable logic element 200 is formed on a semiconductor substrate 0, while the configurable computing element 100 is stacked on/above the configurable logic element 200. The configurable computing element 100 and the configurable logic element 200 are coupled through a plurality of contact vias (not shown in these figures). The configurable computing element 100 comprises at least a 3D-$M_V$ array. Within the 3D-$M_V$ array, at least one set of the address lines are oriented in a direction perpendicular to the front surface of the substrate. Because the 3D-$M_V$ has the largest storage density among of semiconductor memories, it can store the LUTs for a large number of math functions and/or the LUTs with a high precision.

The preferred 3D-$M_V$ array in FIG. 11A is based on vertical diodes or diode-like devices. In this preferred embodiment, the 3D-$M_V$ array comprises a plurality of vertical memory strings 16M-16O placed side-by-side. Each memory string (e.g. 16M) comprises a plurality of vertically stacked memory cells (e.g. 7am-7hm). The 3D-$M_V$ array comprises a plurality of horizontal address lines (word lines) 6a-6h which are vertically stacked above each other. After etching through the horizontal address lines 6a-6h to form a plurality of vertical memory wells 25, the sidewalls of the memory wells 25 are covered with a programmable layer 21. The memory wells 25 are then filled with a conductive materials to form vertical address lines (bit lines) 23. The conductive materials could comprise metallic materials or doped semiconductor materials. The memory cells 7am-7hm are formed at the intersections of the word lines 6a-6h and the bit line 23. The programmable layer 21 could be one-time-programmable (OTP, e.g. an antifuse layer) or multiple-time-programmable (MPT, e.g. a resistive RAM layer).

To minimize interference between memory cells, a diode is formed between the word line and the bit line. This diode may be formed by the programmable layer 21, which could have an electrical characteristic of a diode per se. Alternatively, this diode may be formed by depositing an extra diode layer on the sidewall of the memory well (not shown in this figure). As a third option, this diode may be formed naturally between the word line and the bit line, i.e. to form a built-in junction, e.g. P-N junction, or Schottky junction.

The preferred 3D-$M_V$ array in FIG. 11B is based on vertical transistors or transistor-like devices. In this preferred embodiment, the 3D-$M_V$ array comprises a plurality of vertical memory strings 16X, 16Y placed side-by-side. Each memory string (e.g. 16X) comprises a plurality of vertically stacked memory cells (e.g. 9ax-9hx). Each memory cell (e.g. 9fx) comprises a vertical transistor, which includes a gate 31, a storage layer 33 and a vertical channel 35. The storage layer 33 could comprise oxide-nitride-oxide layers, oxide-poly silicon-oxide layers, or the like. The vertical channels 35 of the memory cells 9ax-9hx collectively form a vertical address line. This preferred 3D-$M_V$ array is a 3D-NAND and its manufacturing details are well known to those skilled in the art.

In the preferred embodiments of FIGS. 11A-11B, the transistors 0t are formed on the substrate 0 and they are conventional transistors. These transistors 0t are coupled by interconnects 0M1, 0M2. In addition, the 3D-$M_V$ array is communicatively coupled with the transistors 0t through a plurality of contact vias (not shown in this figure). It should be noted that the transistors 0t and interconnects 0M1, 0M2 can form not only configurable logic elements 200, but also configurable interconnects (not shown in this figure).

Referring now to FIGS. 12A-12C, a preferred configurable computing-array die 400 using two-sided integration is disclosed. It is a monolithic integrated circuit comprising a semiconductor substrate 0. The substrate 0 has a front side 0F (towards the +z direction) and a back side 0B (towards the −z direction). In this preferred embodiment, the configuration logic elements 200AA-200BB are formed at the front side 0F of the substrate 0 (FIG. 12A), while the configurable computing elements 100AA-100BB are formed at the back side 0B of the substrate 0 (FIG. 12B). They are coupled through a plurality of through-substrate vias 160 (including 160a-160c) (FIG. 12C). Examples of the through-substrate vias include through-silicon vias (TSV). Alternatively, the configurable computing elements 100AA-100BB are formed at the front side 0F, while the configurable logic elements 200AA-200BB are formed at the back side 0B.

This type of integration, i.e. forming the configurable logic elements 100AA-100BB and the configurable computing elements 200AA-200BB on different sides of the substrate, is referred to as two-sided integration. The two-sided integration can improve computational density and computational complexity. With the conventional 2-D integration, the die size of configurable computing array is the sum of those of the configurable computing elements and the configurable logic elements. With the two-sided integration, the configurable computing elements are moved from aside to the other side. This leads to a smaller die size and a higher computational density. In addition, because the memory transistors in the configurable computing elements and the logic transistors in the configurable logic elements are formed on different sides of the substrate, their manufacturing processes can be optimized separately.

Referring now to FIGS. 13-14C, several preferred configurable computing-array packages 400 are disclosed. In FIG. 13, the preferred configurable computing-array package 400 comprises a configurable computing die 100W and a configurable logic die 200W. The configurable computing die 100W is formed on a first semiconductor substrate 100S and comprises at least an array of configurable computing elements 100AA-100BB. Each configurable computing element 100 comprises a memory array 110 for storing at least a portion of an LUT for a math function. On the other hand, the configurable logic die 200W is formed on a second semiconductor substrate 200S and comprises at least an array of configurable logic elements 200AA-200BB. Each configurable logic element 200 selectively realizes a logic function from a logic library. The configurable computing die 100W and the configurable logic die 200W are located in a same package. In this preferred embodiment, the configurable computing die 100W is stacked on/above the configurable logic die 200W. The configurable computing die 100W and the configurable logic die 200W are communicatively coupled by a plurality of inter-die connections 160. Exemplary inter-die connections include micro-bumps and through-silicon-vias (TSV). The preferred configurable computing array 400 further comprises a plurality of configurable interconnects, each of which selectively realizes an interconnect from an interconnect library. The configurable interconnects could be located on the configurable computing die 100W and/or the configurable logic die 200W.

Figure 14A:
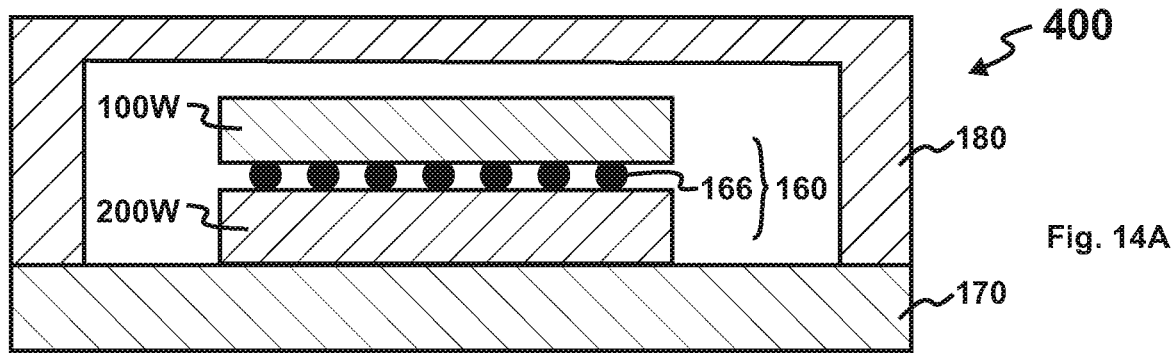
FIGS. 14A-14C are cross-sectional views of three preferred configurable computing-array packages.
Figure 14B:
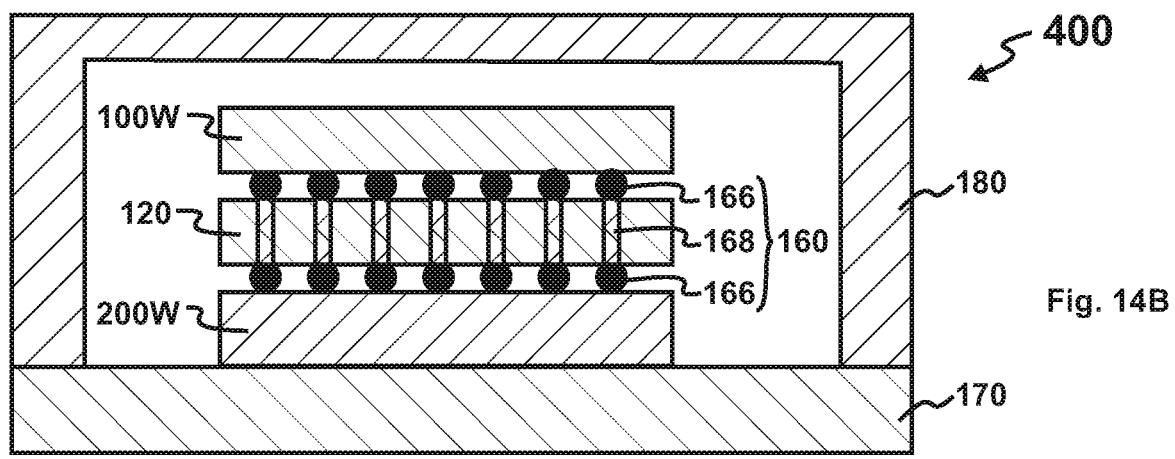
Figure 14C:
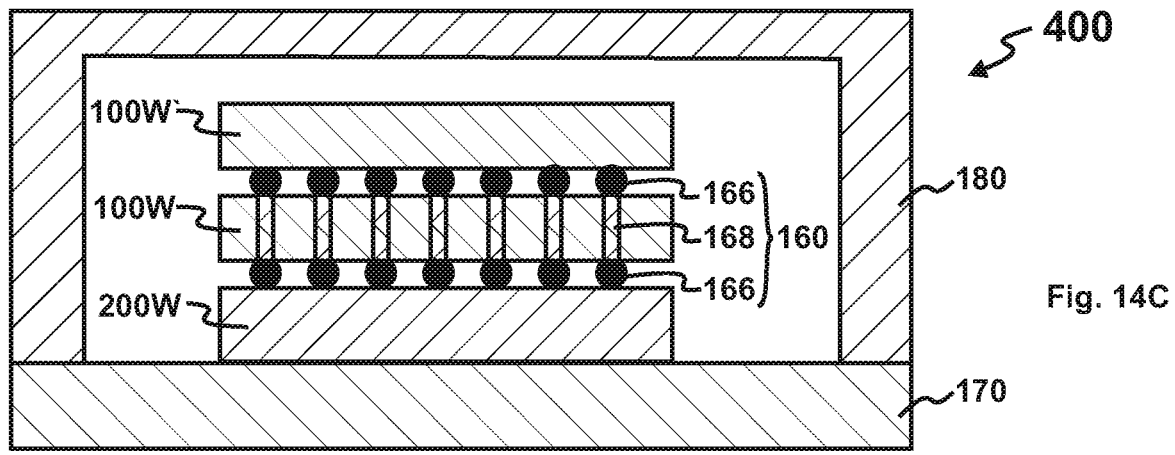

FIGS. 14A-14C show three preferred configurable computing-array packages 400. These preferred embodiments are located in multi-chip packages (MCP). Among them, the configurable computing-array package 400 in FIG. 14A comprises two separate dice: a configurable computing die 100W and a configurable logic die 200W. The dice 100W, 200W are stacked on the package substrate 170 and located in a same package 180. Micro-bumps 166 act as the inter-die connections 160 and provide electrical coupling between the dice 100, 200. In this preferred embodiment, the configurable computing die 100W is stacked on the configurable logic die 200W; the configurable computing die 100W is flipped and then bonded face-to-face with the configurable logic die 200W. Alternatively, the configurable logic die 200W could be stacked on/above the configurable computing die 100W. Either die does not have to be flipped.

The configurable computing-array package 400 in FIG. 14B comprises a configurable computing die 100W, an interposer 120 and a configurable logic die 200W. The interposer 120 comprise a plurality of through-silicon vias (TSV) 168. The TSVs 168 provide electrical couplings between the configurable computing die 100W and the configurable logic die 200W. They offer more freedom in design and facilitate heat dissipation. In this preferred embodiment, the TSVs 168 and the micro-bumps 166 collectively form the inter-die connections 160.

The configurable computing-array package 400 in FIG. 14C comprises at least two configurable computing dice 100W, 100W' and a configurable logic die 200W. These dice 100W, 100W', 200W are separate dice and located in a same package 180. Among them, the configurable computing die 100W' is stacked on the configurable computing die 100W, while the configurable computing die 100W is stacked on the configurable logic die 200W. The dice 100W, 100W', 200W are electrically coupled through the TSVs 168 and the micro-bumps 166. Apparently, the LUT in FIG. 14C has a large capacity than that in FIG. 14A. Similarly, the TSVs 168 and the micro-bumps 166 collectively form the inter-die connections 160.

Although their active elements are disposed in a 3-D space, the configurable computing die 100W and the configurable logic die 200W are separate dice. Accordingly, this type of integration is generally referred to as 2.5-D integration. The 2.5-D integration excels the conventional 2-D integration (i.e. single-level configurable computing array) in many aspects. First of all, the footprint of a conventional 2-D integrated configurable computing array is roughly equal to the sum of those of the configurable computing elements, the configurable logic elements and the configurable interconnects. On the other hand, because the 2.5-D integration moves the configurable computing elements from aside to above, the configurable computing-array package 400 becomes smaller and computationally more powerful. Secondly, because they are physically close and coupled by a large number of inter-die connections 160, the configurable computing die 100W and the configurable logic die 200W have a larger communication bandwidth than the conventional 2-D integrated configurable computing array. Thirdly, the 2.5-D integration benefits manufacturing process. Because the configurable computing die 100W and the configurable logic die 200W are separate dice, the memory transistors in the configurable computing die 100W and the logic transistors in the configurable logic die 200W are formed on separate semiconductor substrates. Consequently, their manufacturing processes can be individually optimized.

The preferred embodiments of the present invention are field-programmable computing-array (FPCA) package. For an FPCA package, all manufacturing processes of the configurable computing die and the configurable logic die are finished in factory. The function of the FPCA package can be electrically defined in the field of use. The concept of FPCA package can be extended to mask-programmed computing-array (MPCA) package. For a MPCA package, the wafers containing the configurable computing elements and/or the wafer containing the configurable logic elements are pre-fabricated and stockpiled. However, certain interconnects on these wafers are not fabricated until the function of the MPCA package is finally defined.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable computing array, comprising:
   at least an array of configurable logic elements including a configurable logic element, wherein said configurable logic element selectively realizes a logic function from a logic library; and
   at least an array of configurable computing elements including first and second configurable computing elements, wherein said first configurable computing element comprises a first memory for storing a first look-up table (LUT) for a first math function; and, said second configurable computing element comprises a second memory for storing a second LUT for a second math function;
   whereby said configurable computing array realizes a math function by programming said configurable logic elements and said configurable computing elements, wherein said math function is a combination of at least said first and second math functions.

2. The configurable computing array according to claim 1, further comprising at least an array of configurable interconnects including a configurable interconnect, wherein said configurable interconnect selectively realizes an interconnect from an interconnect library.

3. The configurable computing array according to claim 1, wherein each of said configurable computing elements comprises a re-programmable memory, whereby each of said configurable computing elements can be re-configured to realize a different math function by loading the LUT for said different math function into said re-programmable memory.

4. The configurable computing array according to claim 1, wherein said configurable logic elements and said configurable computing elements are disposed on a same physical level.

5. The configurable computing array according to claim 1, wherein said configurable logic elements and said configurable computing elements are disposed on different physical levels.

6. The configurable computing-array package according to claim 5, wherein said first and second memories comprise at least a three-dimensional memory (3D-M) array.

7. The configurable computing array according to claim 6, wherein said 3D-M array is stacked above said configurable logic element.

8. The configurable computing array according to claim 5, further comprising a semiconductor substrate with first and second sides, wherein
said configurable logic elements are disposed on said first side;
said configurable computing elements are disposed on said second side;
said configurable logic elements and said configurable computing elements are coupled by a plurality of through-substrate vias through said semiconductor substrate.

9. The configurable computing array according to claim 5, wherein:
said configurable logic elements are disposed on at least a configurable logic die;
said configurable computing elements are disposed on at least a configurable computing die;
said configurable logic die and said configurable computing die are located in a same package.

10. The configurable computing array according to claim 1, further comprising at least one multiplier.

11. A configurable computing array, comprising:
at least an array of configurable interconnects including a configurable interconnect, wherein said configurable interconnect selectively realizes an interconnect from an interconnect library; and
at least an array of configurable computing elements including first and second configurable computing elements, wherein said first configurable computing element comprises a first memory for storing a first look-up table (LUT) for a first math function;
and, said second configurable computing element comprises a second memory for storing a second LUT for a second math function;
whereby said configurable computing array realizes a math function by programming said configurable interconnects and said configurable computing elements, wherein said math function is a combination of at least said first and second math functions.

12. The configurable computing array according to claim 11, further comprising at least an array of configurable logic elements including a configurable logic element, wherein said configurable logic element selectively realizes a logic function from a logic library.

13. The configurable computing array according to claim 11, wherein each of said configurable computing elements comprises a re-programmable memory, whereby each of said configurable computing elements can be re-configured to realize a different math function by loading the LUT for said different math function into said re-programmable memory.

14. The configurable computing array according to claim 11, wherein said configurable interconnects and said configurable computing elements are disposed on a same physical level.

15. The configurable computing array according to claim 11, wherein said configurable interconnects and said configurable computing elements are disposed on different physical levels.

16. The configurable computing array according to claim 15, wherein said first and second memories comprise at least a three-dimensional memory (3D-M) array.

17. The configurable computing array according to claim 16, wherein said 3D-M array is stacked above said configurable interconnect.

18. The configurable computing array according to claim 15, further comprising a semiconductor substrate with first and second sides, wherein
said configurable logic elements are disposed on said first side;
said configurable computing elements are disposed on said second side;
said configurable logic elements and said configurable computing elements are coupled by a plurality of through-substrate vias through said semiconductor substrate.

19. The configurable computing array according to claim 15, wherein:
said configurable logic elements are disposed on at least a configurable logic die;
said configurable computing elements are disposed on at least a configurable computing die;
said configurable logic die and said configurable computing die are located in a same package.

20. The configurable computing array according to claim 11, further comprising at least one multiplier.

* * * * *